US012053878B2

(12) United States Patent
Fukushima et al.

(10) Patent No.: US 12,053,878 B2
(45) Date of Patent: *Aug. 6, 2024

(54) ACTUATOR SENSING DEVICE AND ACTUATOR CONTROL SYSTEM

(71) Applicant: THK CO., LTD., Tokyo (JP)

(72) Inventors: Katsuya Fukushima, Tokyo (JP); Masashi Ishii, Tokyo (JP); Hiroki Niwa, Tokyo (JP); Shigeki Hayashi, Kawasaki (JP); Akira Suzuki, Tokyo (JP); Kazuto Oga, Tokyo (JP); Shogo Wakuta, Tokyo (JP); Satoshi Hara, Tokyo (JP); Tomofumi Mizuno, Tokyo (JP)

(73) Assignee: THK CO., LTD., Tokyo (JP)

( * ) Notice: Subject to any disclaimer, the term of this patent is extended or adjusted under 35 U.S.C. 154(b) by 837 days.

This patent is subject to a terminal disclaimer.

(21) Appl. No.: 17/263,729

(22) PCT Filed: Aug. 1, 2019

(86) PCT No.: PCT/JP2019/030260
§ 371 (c)(1),
(2) Date: Jan. 27, 2021

(87) PCT Pub. No.: WO2020/027272
PCT Pub. Date: Feb. 6, 2020

(65) Prior Publication Data
US 2021/0299889 A1 Sep. 30, 2021

(30) Foreign Application Priority Data
Aug. 1, 2018 (JP) .................................. 2018-144869

(51) Int. Cl.
*B25J 15/06* (2006.01)
*B25J 13/08* (2006.01)

(52) U.S. Cl.
CPC ......... *B25J 15/0633* (2013.01); *B25J 13/087* (2013.01)

(58) Field of Classification Search
CPC ...... B25J 15/0633; B25J 15/06; B25J 13/087; H05K 13/0409; G01F 5/00
See application file for complete search history.

(56) References Cited

U.S. PATENT DOCUMENTS 7,261,350 B2 * 8/2007 Isetani ................. B25J 15/0616
294/185
7,471,019 B2 * 12/2008 Motherway .......... H02K 41/031
310/15

(Continued)

FOREIGN PATENT DOCUMENTS

JP 2006-179588 A 7/2006
JP 2008-227402 A 9/2008

(Continued)

OTHER PUBLICATIONS

Office Action dated Jul. 15, 2022, issued in counterpart IN application No. 202147006835, with English Translation. (5 pages).

(Continued)

*Primary Examiner* — Stephen A Vu
(74) *Attorney, Agent, or Firm* — WHDA, LLP (57) ABSTRACT

Provided is a sensing device to be applied to an actuator including a shaft that is movable in an axial direction, the shaft including a hollow part formed on at least a tip side of the shaft such that an interior of the shaft is hollow, the actuator being configured to generate a negative pressure in the hollow part to suction a workpiece to a tip of the shaft, thereby picking up the workpiece. The sensing device includes a flow sensor provided in a middle of an air passage to detect a flow rate of air flowing through the air passage, the air passage being a passage through which air sucked out from the hollow part flows when the negative pressure is (Continued)

applied to the hollow part, and a pressure sensor provided in a middle of the air passage, to detect a pressure in the air passage.

3 Claims, 4 Drawing Sheets

(56) References Cited

U.S. PATENT DOCUMENTS

| | | | | |
|---|---|---|---|---|
| 7,484,782 | B2* | 2/2009 | Rich | B65G 47/914 |
| | | | | 414/752.1 |
| 8,240,028 | B2* | 8/2012 | Kanai | H05K 13/0413 |
| | | | | 29/739 |
| 8,550,523 | B2* | 10/2013 | Rachkov | H05K 13/0413 |
| | | | | 294/185 |
| 11,735,991 | B2* | 8/2023 | Fukushima | H02P 25/06 |
| | | | | 700/260 |
| 2004/0042890 | A1* | 3/2004 | Hirata | H05K 13/0409 |
| | | | | 414/752.1 |
| 2018/0122664 | A1 | 5/2018 | Hsu et al. | |

FOREIGN PATENT DOCUMENTS

| | | |
|---|---|---|
| JP | 2009-16512 A | 1/2009 |
| JP | 2009-164347 A | 7/2009 |

OTHER PUBLICATIONS

International Search Report dated Oct. 21, 2019, issued in counterpart International Application No. PCT/JP2019/030260 with English translation (4 pages).

* cited by examiner

ACTUATOR SENSING DEVICE AND ACTUATOR CONTROL SYSTEM

TECHNICAL FIELD

The present invention relates to an actuator sensing device and actuator control system.

BACKGROUND ART

An actuator that picks up and places a workpiece is known in which a negative pressure is applied to an interior of a shaft in a state where a tip of the hollow shaft is in contact with the workpiece, to suction the workpiece to the tip of the shaft (e.g., see Patent Document 1).

CITATION LIST

Patent Literature

Patent Document 1: Japanese Patent Laid-Open No. 2009-164347

SUMMARY OF INVENTION

Technical Problem

If a workpiece is not appropriately suctioned to a tip of a shaft when picking up the workpiece with such an actuator as in a conventional art described above, there might be, for example, a disadvantage that the workpiece might drop halfway when the workpiece is moved from a pickup position to a place position. Therefore, in a case of picking up the workpiece, it is necessary to determine whether or not the workpiece is appropriately suctioned to the tip of the shaft.

Here, as an example of a method of determining whether or not the workpiece is appropriately suctioned to the tip of the shaft, it is conceivable a method of attaching, to the actuator, a pressure sensor that detects a pressure in the shaft, and determining whether or not the workpiece is suctioned to the tip of the shaft, based on a detected value of the pressure sensor after starting to suck air from an interior of the shaft.

Additionally, in a case of picking up a comparatively small workpiece, there may be a case where a suction nozzle having a comparatively small diameter is mounted to the tip of the shaft. In this case, a pressure difference tends to decrease in the shaft between a state where the workpiece is suctioned to the suction nozzle and a state where the workpiece is not suctioned, and hence there is possibility that accurate determination is difficult as to whether or not the workpiece is appropriately suctioned to the suction nozzle.

An object of the present invention, which has been made in view of such actual situations as described above, is to provide an effective technology in suitably performing suction determination of a large number of various workpieces.

Solution to Problem

The present invention provides a sensing device to be applied to an actuator comprising a shaft that is movable in an axial direction, the shaft including a hollow part formed on at least a tip side of the shaft such that an interior of the shaft is hollow, the actuator being configured to generate a negative pressure in the hollow part to suction a workpiece to a tip of the shaft, thereby picking up the workpiece. The sensing device comprises a flow sensor provided in a middle of an air passage to detect a flow rate of air flowing through the air passage, the air passage being a passage through which air sucked out from the hollow part flows when the negative pressure is applied to the hollow part of the shaft, and a pressure sensor provided in a middle of the air passage, to detect a pressure in the air passage.

Advantageous Effects of Invention

According to the present invention, an effective technology in suitably performing suction determination of a large number of various workpieces can be provided.

DESCRIPTION OF EMBODIMENTS

In an actuator to which a sensing device according to the present invention is applied, a shaft is movable in an axial direction. Furthermore, at a tip of the shaft, a hollow part is formed such that an interior of the shaft is hollow. The hollow part communicates with an air passage, and air in the hollow part is sucked out through the air passage, so that a negative pressure can be generated at the tip of the shaft. According to this actuator, the negative pressure is generated at the tip in a state where the tip of the shaft is in contact with a workpiece, so that the workpiece can be suctioned to the tip. Then, if the shaft is moved upward in an axial direction in a state where the workpiece is suctioned to the tip of the shaft, the workpiece can be picked up.

Furthermore, in a middle of the air passage, disposed is the sensing device including a flow sensor that detects a flow rate of air flowing through the air passage, and a pressure sensor that detects a pressure in the air passage. According to this sensing device, it is possible to determine whether or not the workpiece is appropriately suctioned to the shaft tip (suction determination), by use of the flow rate detected by the flow sensor and/or the pressure detected by the pressure sensor, when picking up the workpiece.

If air in the hollow part is sucked out in a state where the workpiece is in contact with the tip of the shaft, an air volume of the hollow part gradually decreases, and a pressure in the hollow part gradually decreases (a negative pressure degree of the hollow part gradually increases), which finally brings the hollow part into a state close to vacuum. In this process, even in a stage before the hollow part reaches the state close to vacuum, if the pressure in the hollow part decreases to such an extent that the workpiece can be suctioned to the tip of the shaft, it is possible to pick up the workpiece in a state where the workpiece is suctioned to the tip of the shaft. That is, if it can be detected that the pressure in the hollow part decreases to such an extent that the workpiece can be suctioned to the tip of the shaft, it is possible to pick up the workpiece before the hollow part reaches the state close to vacuum, which can shorten tact time. To solve the problem, it is considered that there is a method of attaching only the pressure sensor to the air passage, and determining that the workpiece is suctioned to the tip of the shaft, on condition that the pressure detected by the pressure sensor is equal to or lower than a predetermined pressure. The predetermined pressure described herein is a pressure by which it can be determined that the negative pressure with which the workpiece may be suctioned is generated at the tip of the shaft, if a pressure in the air passage is equal to or lower than the predetermined pressure, and the predetermined pressure is, for example, a pressure obtained by subtracting a predetermined margin from a maximum value of the pressure with which the workpiece can be suctioned to the tip of the shaft.

Additionally, in a case of picking up a comparatively small workpiece or another case, there is possibility that a suction nozzle having a comparatively small diameter is mounted to the tip of the shaft. In this case, a difference tends to decrease in pressure in the air passage between a state where the workpiece is suctioned to the suction nozzle (a state where the suction nozzle is closed) and a state where the workpiece is not suctioned to the suction nozzle (a state where the suction nozzle is opened). Accordingly, the predetermined pressure is a pressure close to the pressure in the air passage in the state where the workpiece is not suctioned to the suction nozzle. Furthermore, the pressure detected by the pressure sensor may include error, tolerance or the like. Therefore, in a case where the suction nozzle having the comparatively small diameter is mounted to the tip of the shaft, there is possibility that accurate suction determination is difficult by a method of comparing the pressure detected by the pressure sensor with the predetermined pressure. On the other hand, it is considered that there is also a method of setting, in advance, a determination pressure that is a pressure sufficiently lower than the above predetermined pressure (the pressure having a sufficiently large negative pressure degree), and determining that the workpiece is suctioned to the tip of the shaft, on condition that the pressure detected by the pressure sensor decreases to the determination pressure or lower. However, a problem is that from when air in the hollow part starts to be sucked out until the pressure in the air passage decreases to the determination pressure or lower, extended time is required and hence the tact time unnecessarily increases.

On the other hand, according to the sensing device of the present invention, in the case where the suction nozzle having the comparatively small diameter is mounted to the tip of the shaft, or the like, as in the case of picking up the comparatively small workpiece, or the like, the suction determination can be performed by using the flow rate detected by the flow sensor. Here, if air in the hollow part is sucked out in the state where the workpiece is in contact with the tip of the shaft, as described above, the air volume of the hollow part gradually decreases, and accordingly the pressure in the hollow part gradually decreases (the negative pressure degree of the hollow part gradually increases). Accordingly, the flow rate of air flowing through the air passage gradually decreases with the pressure decrease in the hollow part. That is, in a process where the air in the hollow part is sucked out in the state where the workpiece is in contact with the tip of the shaft, the flow rate of air flowing through the air passage correlates with the pressure in the hollow part. Therefore, it can be determined that the workpiece is suctioned to the shaft tip, on condition that the flow rate detected by the flow sensor decreases to a predetermined flow rate or smaller. The predetermined flow rate described herein is a flow rate by which it can be determined that the negative pressure with which the workpiece may be suctioned is generated at the tip of the shaft, if the flow rate detected by the flow sensor decreases to the predetermined flow rate or smaller. In other words, the predetermined flow rate is a flow rate by which it can be determined that the pressure in the air passage decreases to the predetermined pressure or lower, if the flow rate detected by the flow sensor decreases to the predetermined flow rate or smaller. Consequently, also in the case where the suction nozzle having the comparatively small diameter is mounted to the tip of the shaft, the suction determination of the workpiece can be accurately performed, while inhibiting unnecessary increase of tact time. Note that from a viewpoint of more correctly performing the suction determination of the workpiece in the case where the suction nozzle having the comparatively small diameter is mounted to the tip of the shaft, it may be determined that the workpiece is suctioned to the tip of the shaft, on condition that the flow rate detected by the flow sensor is below the predetermined flow rate and that the pressure detected by the pressure sensor is below the predetermined pressure. According to this method, it can be more correctly determined whether or not the workpiece is appropriately suctioned to the tip of the shaft, while minimizing the increase of the tact time.

Note that in a case where the suction nozzle having a comparatively large diameter is mounted to the tip of the shaft, as in a case of picking up the workpiece having the comparatively large size, or the like, a difference tends to increase in pressure in the air passage between the state where the workpiece is suctioned to the suction nozzle (the state where the suction nozzle is closed) and the state where the workpiece is not suctioned to the suction nozzle (the state where the suction nozzle is opened). Accordingly, the predetermined pressure is a pressure sufficiently lower than the pressure in the air passage in the state where the workpiece is not suctioned to the suction nozzle. Therefore, even if the pressure detected by the pressure sensor includes error, tolerance or the like, accurate suction determination can be performed by the method of comparing the pressure detected by the pressure sensor with the predetermined pressure.

Therefore, by use of the sensing device according to the present invention, it can be accurately and immediately determined whether or not the workpiece is appropriately suctioned to the tip of the shaft, without being influenced by the diameter of the suction nozzle to be mounted to the tip of the shaft. Consequently, it is possible to suitably perform suction determination of a large variety of workpieces.

Hereinafter, specific examples of the present invention will be described with reference to the drawings. A dimension, material, shape, relative arrangement and the like of a component described in the present example do not intend to restrict a technical scope of the invention unless otherwise described.

First Embodiment

Figure 1:
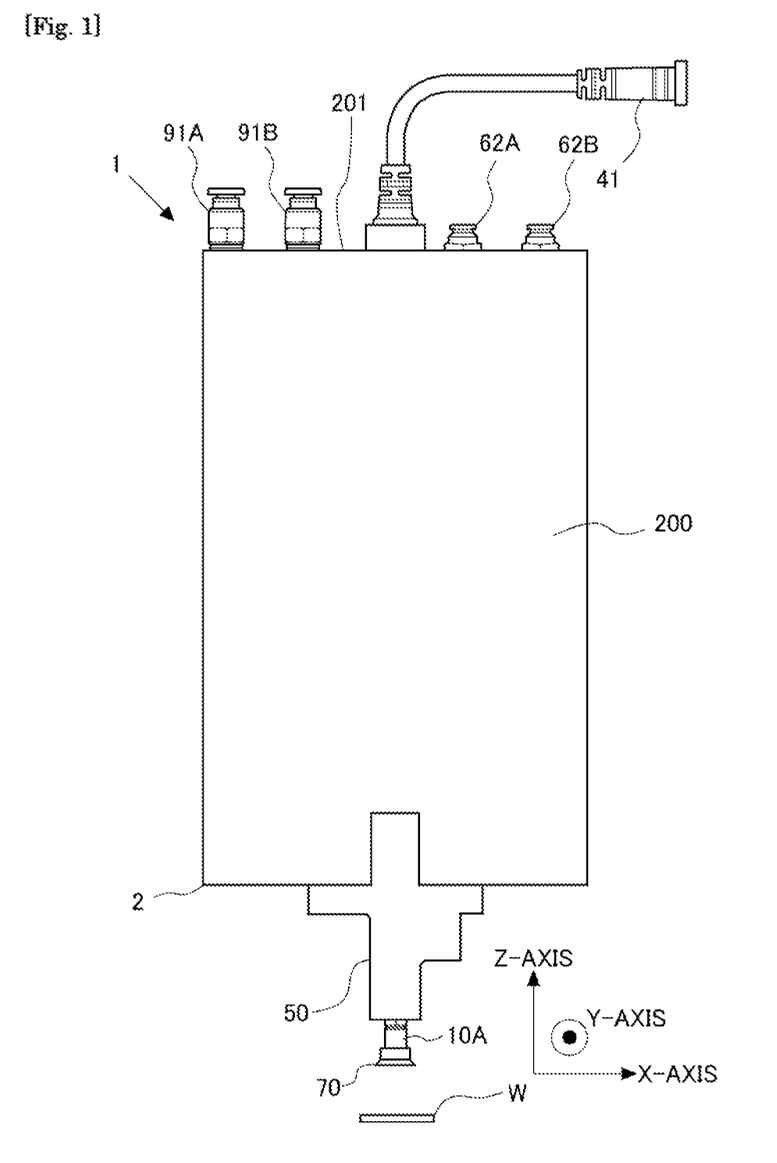
FIG. 1 is an appearance view of an actuator according to an embodiment.
Figure 2:
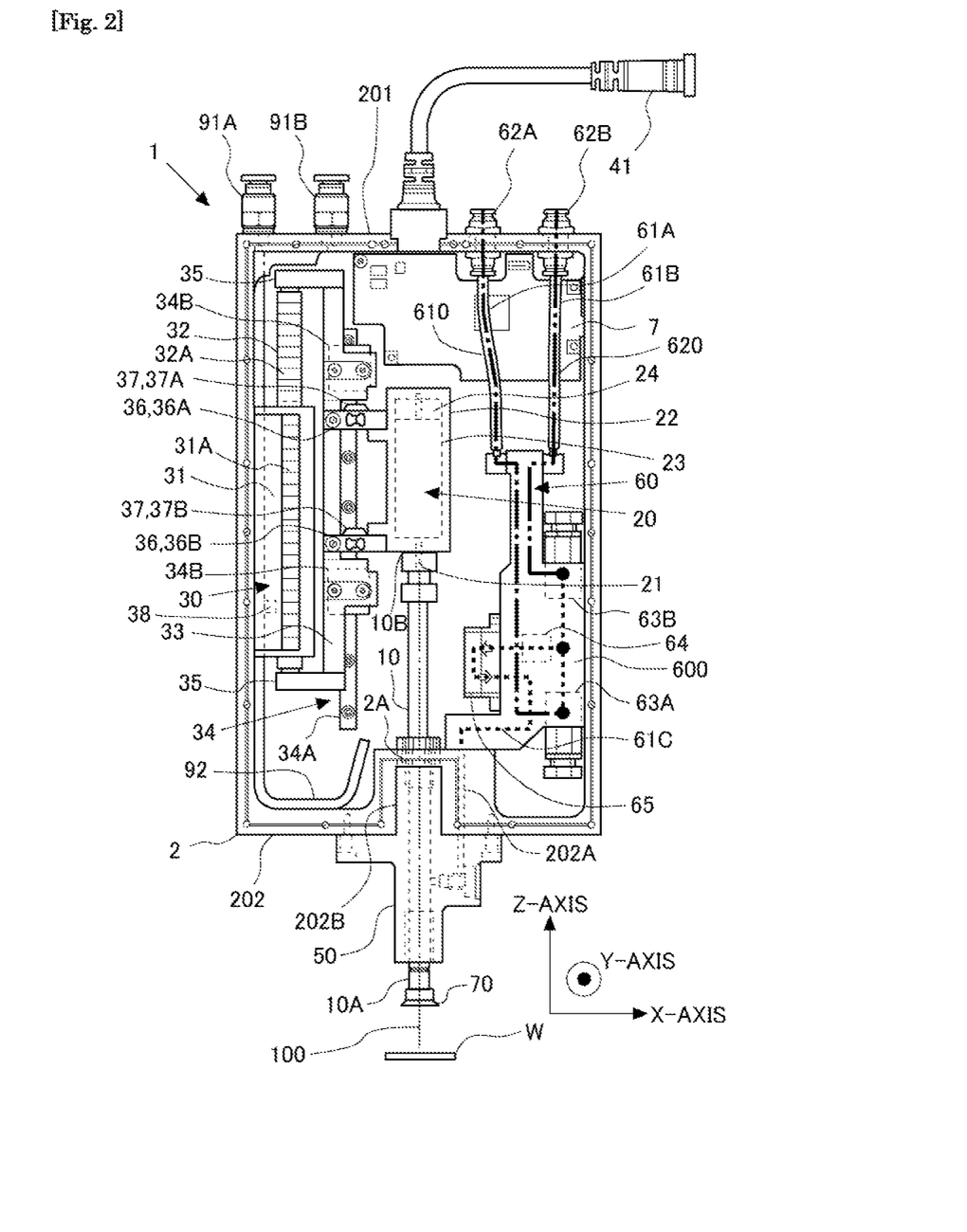
FIG. 2 is a schematic configuration view illustrating an inner structure of the actuator according to the embodiment.

FIG. 1 is an appearance view of an actuator 1 according to the present embodiment. The actuator 1 includes a housing 2 having a substantially rectangular parallelepiped outer shape, and a lid 200 is attached to the housing 2. FIG. 2 is a schematic configuration view illustrating an inner structure of the actuator 1 according to the present embodiment. A part of a shaft 10 is housed within the housing 2. The shaft 10 is formed to be hollow on a tip 10A side. In a material of the shaft 10 and the housing 2, for example, a metal (e.g., aluminum) may be used, or a resin or the like may be used.

Note that in the following description, an XYZ orthogonal coordinate system will be set, and positions of respective members will be described with reference to this XYZ orthogonal coordinate system. A long side direction of the largest surface of the housing 2, i.e., a direction of a central axis 100 of the shaft 10 is a Z-axis direction, a short side direction of the largest surface of the housing 2 is an X-axis direction, and a direction that is orthogonal to the largest surface of the housing 2 is a Y-axis direction. The Z-axis direction is also a perpendicular direction. Note that hereinafter, an upper side in the Z-axis direction in FIG. 2 is an upper side of the actuator 1, and a lower side in the Z-axis direction in FIG. 2 is a lower side of the actuator 1. Furthermore, a right side in the X-axis direction in FIG. 2 is a right side of the actuator 1, and a left side in the X-axis direction in FIG. 2 is a left side of the actuator 1. Additionally, a front side in the Y-axis direction in FIG. 2 is a front side of the actuator 1, and a back side in the Y-axis direction in FIG. 2 is a back side of the actuator 1. The housing 2 is formed such that a dimension in the Z-axis direction is larger than a dimension in the X-axis direction, and a dimension in the X-axis direction is larger than a dimension in the Y-axis direction. In the housing 2, a region corresponding to one surface (a front surface in FIG. 2) orthogonal to the Y-axis direction is open, and this opening is closed with the lid 200. The lid 200 is fixed to the housing 2 with, for example, screws.

The housing 2 houses therein a rotating motor 20 that rotates the shaft 10 about the central axis 100, a linear motion motor 30 that moves the shaft 10 relatively straight in a direction along the central axis 100 (i.e., the Z-axis direction) relative to the housing 2, and an air control mechanism 60. Furthermore, a shaft housing 50 into which the shaft 10 is inserted is attached to a lower end face 202 of the housing 2 in the Z-axis direction. In the housing 2, a recess 202B is formed to be recessed from the lower end face 202 toward an interior of the housing 2, and a part of the shaft housing 50 is inserted into the recess 202B. A through hole 2A in the Z-axis direction is formed in an upper end of the recess 202B in the Z-axis direction, and the shaft 10 is inserted into the through hole 2A and the shaft housing 50. The tip 10A of the shaft 10 on the lower side in the Z-axis direction protrudes outward from the shaft housing 50. The shaft 10 is provided at a center of the housing 2 in the X-axis direction and a center of the housing in the Y-axis direction. That is, the shaft 10 is provided such that a central axis extending in the Z-axis direction through the center of the housing 2 in the X-axis direction and the center of the housing in the Y-axis direction is superimposed on the central axis 100 of the shaft 10. The shaft 10 is moved straight in the Z-axis direction by the linear motion motor 30, and is rotated about the central axis 100 by the rotating motor 20.

A base end 10B side of the shaft 10 that is an end on a side opposite to the tip 10A (an upper end in the Z-axis direction) is housed in the housing 2, and connected to an output shaft 21 of the rotating motor 20. The rotating motor 20 rotatably supports the shaft 10. A central axis of the output shaft 21 of the rotating motor 20 coincides with the central axis 100 of the shaft 10. The rotating motor 20 includes, in addition to the output shaft 21, a stator 22, a rotor 23 that rotates in the stator 22, and a rotary encoder 24 that detects a rotation angle of the output shaft 21. The rotor 23 rotates relative to the stator 22, and the output shaft 21 and the shaft 10 also rotate in conjunction with the stator 22.

The linear motion motor 30 includes a stator 31 fixed to the housing 2, and a mover 32 that relatively moves in the Z-axis direction relative to the stator 31. The linear motion motor 30 is, for example, a linear motor. The stator 31 is provided with a plurality of coils 31A, and the mover 32 is provided with a plurality of permanent magnets 32A. The coils 31A are arranged at a predetermined pitch in the Z-axis direction, and a plurality of sets of three coils 31A of U, V, and W-phases are provided. In the present embodiment, a three-phase armature current is applied to the coils 31A of the U, V, and W-phases to generate a straight moving magnetic field, and the mover 32 is straight moved relative to the stator 31. The linear motion motor 30 is provided with a linear encoder 38 that detects a relative position of the mover 32 to the stator 31. Note that in place of the above configuration, the stator 31 may be provided with a permanent magnet, and the mover 32 may be provided with a plurality of coils.

The mover 32 of the linear motion motor 30 is coupled to the stator 22 of the rotating motor 20 via a linear motion table 33. The linear motion table 33 is movable with movement of the mover 32 of the linear motion motor 30. The movement of the linear motion table 33 is guided in the Z-axis direction by a linear motion guide device 34. The linear motion guide device 34 includes a rail 34A fixed to the housing 2, and a slider block 34B attached to the rail 34A. The rail 34A is configured to extend in the Z-axis direction, and the slider block 34B is configured to be movable along the rail 34A in the Z-axis direction.

The linear motion table 33 is fixed to the slider block 34B, and is movable together with the slider block 34B in the Z-axis direction. The linear motion table 33 is coupled to the mover 32 of the linear motion motor 30 via two coupling arms 35. The two coupling arms 35 couple opposite ends of the mover 32 in the Z-axis direction to opposite ends of the linear motion table 33 in the Z-axis direction. Furthermore, the linear motion table 33 is coupled, on a central side of the opposite ends, to the stator 22 of the rotating motor 20 via two coupling arms 36. Note that the coupling arm 36 on the upper side in the Z-axis direction will be referred to as a first arm 36A, and the coupling arm 36 on the lower side in the Z-axis direction will be referred to as a second arm 36B. Furthermore, the first arm 36A and the second arm 36B will be referred to simply as the coupling arms 36 when the arms are not distinguished. For the stator 22 of the rotating motor 20, since the linear motion table 33 is coupled to the stator 22 of the rotating motor 20 via the coupling arms 36, the stator 22 of the rotating motor 20 also moves with the movement of the linear motion table 33. The coupling arm 36 has a quadrangular cross section. A strain gauge 37 is fixed to a surface of each coupling arm 36 which faces upward in the Z-axis direction. Note that the strain gauge 37 fixed to the first arm 36A will be referred to as a first strain gauge 37A, and the strain gauge 37 fixed to the second arm 36B will be referred to as a second strain gauge 37B. The first strain gauge 37A and the second strain gauge 37B will be referred to simply as the strain gauges 37 when the gauges are not distinguished. Note that two strain gauges 37 of the present embodiment are provided on surfaces of the coupling arms 36 which face upward in the Z-axis direction, respectively. In place of the surfaces, the gauges may be provided on surfaces of the coupling arm 36 that face downward in the Z-axis direction.

The air control mechanism 60 is a mechanism to generate a positive pressure or a negative pressure at the tip 10A of the shaft 10. That is, the air control mechanism 60 sucks air in the shaft 10 during pickup of a workpiece W, to generate the negative pressure at the tip 10A of the shaft 10. Consequently, the workpiece W is suctioned to the tip 10A of the shaft 10. Furthermore, air is supplied into the shaft 10, to generate the positive pressure at the tip 10A of the shaft 10. Thus, the workpiece W is removed from the tip 10A of the shaft 10.

The air control mechanism 60 includes a positive pressure passage 61A (see a dashed chain line) through which positive pressure air flows, a negative pressure passage 61B (see a double-dashed chain line) through which negative pressure air flows, and a shared passage 61C (see a broken line) shared by the positive pressure air and the negative pressure air. The positive pressure passage 61A has one end connected to a positive pressure connector 62A provided on an upper end face 201 of the housing 2 in the Z-axis direction, and the positive pressure passage 61A has the other end connected to a solenoid valve for positive pressure (hereinafter, referred to as a positive pressure solenoid valve 63A). The positive pressure solenoid valve 63A is opened and closed by an after mentioned controller 7. Note that the positive pressure passage 61A has one end portion constituted of a tube 610, and the other end portion constituted of a hole made in a block 600. The positive pressure connector 62A extends through the upper end face 201 of the housing 2 in the Z-axis direction, and the positive pressure connector 62A is connected to an external tube linked to an air discharging pump or the like.

The negative pressure passage 61B has one end connected to a negative pressure connector 62B provided on the upper end face 201 of the housing 2 in the Z-axis direction, and the negative pressure passage 61B has the other end connected to a solenoid valve for negative pressure (hereinafter, referred to as a negative pressure solenoid valve 63B). The negative pressure solenoid valve 63B corresponds to a valve unit according to the present invention, and is opened and closed by the after-described controller 7. Note that the negative pressure passage 61B has one end portion constituted of a tube 620, and the other end portion constituted of a hole made in the block 600. The negative pressure connector 62B extends through the upper end face 201 of the housing 2 in the Z-axis direction, and the negative pressure connector 62B is connected to an external tube linked to an air sucking pump or the like.

The shared passage 61C is constituted of a hole made in the block 600. The shared passage 61C has one end branching into two to be connected to the positive pressure solenoid valve 63A and the negative pressure solenoid valve 63B, and the shared passage 61C has the other end connected to an air flow passage 202A that is a through hole formed in the housing 2. The air flow passage 202A communicates with the shaft housing 50. The negative pressure solenoid valve 63B is opened and the positive pressure solenoid valve 63A is closed, to communicate between the negative pressure passage 61B and the shared passage 61C, thereby generating the negative pressure in the shared passage 61C. Then, air is sucked from the shaft housing 50 through the air flow passage 202A. On the other hand, the positive pressure solenoid valve 63A is opened and the negative pressure solenoid valve 63B is closed, to communicate between the positive pressure passage 61A and the shared passage 61C, thereby generating the positive pressure in the shared passage 61C. Then, air is supplied into the shaft housing 50 through the air flow passage 202A.

The shared passage 61C is provided with a sensing device according to the present invention. That is, the shared passage 61C is provided with a pressure sensor 64 that detects a pressure of air in the shared passage 61C, and a flow sensor 65 that detects a flow rate of air in the shared passage 61C. In this case, the pressure sensor 64 is disposed in the shared passage 61C between the negative pressure solenoid valve 63B and the flow sensor 65. In other words, the flow sensor 65 is disposed at a position closer to the tip 10A of the shaft 10 than the pressure sensor 64 is. Note that the pressure sensor 64 and the flow sensor 65 do not necessarily have to be arranged in the shared passage 61C, and may be provided in the air flow passage 202A. In short, the pressure sensor 64 and the flow sensor 65 may only be arranged in a path through which air flows (the air passage) between the negative pressure solenoid valve 63B and the tip 10A of the shaft 10.

Here, in the actuator 1 illustrated in FIG. 2, the positive pressure passage 61A and the negative pressure passage 61B have a part constituted of a tube, and the other part constituted of a hole made in the block 600. The present invention is not limited to this embodiment, and all the passages may be constituted of tubes, or all the passages may be constituted of holes made in the block 600. This also applies to the shared passage 61C, and the passage may be entirely constituted of a tube, or may be constituted by combined use of the tube. Note that a material of the tube 610 and the tube 620 may be a material such as a resin having flexibility, or may be a material such as a metal that does not have any flexibility. Furthermore, an atmospheric pressure may be supplied, instead of supplying the positive pressure to the shaft housing 50 by use of the positive pressure passage 61A.

Additionally, on the upper end face 201 of the housing 2 in the Z-axis direction, provided are a connector (hereinafter, referred to as an inlet connector 91A) that is an inlet of air for cooling the rotating motor 20 and a connector (hereinafter, referred to as an outlet connector 91B) that is an outlet of air from the housing 2. The inlet connector 91A and the outlet connector 91B extend through the upper end face 201 of the housing 2 so that air can flow through. A tube linked to an air discharge pump or the like is connected to the inlet connector 91A from outside the housing 2, and a tube that discharges air flowing out of the housing 2 is connected to the outlet connector 91B from outside the housing 2. The interior of the housing 2 is provided with a metal pipe (hereinafter, referred to as a cooling pipe 92) through which air for cooling the rotating motor 20 flows, and the cooling pipe 92 has one end connected to the inlet connector 91A. The cooling pipe 92 is formed to extend from the inlet connector 91A in the Z-axis direction to a vicinity of the lower end face 202 of the housing 2, and to curve in the vicinity of the lower end face 202 such that the pipe, at the other end, faces the rotating motor 20. Thus, air is supplied from the lower side in the Z-axis direction into the housing 2, thereby allowing efficient cooling. Furthermore, the cooling pipe 92 extends through the stator 31, to take heat from the coils 31A of the linear motion motor 30. The coils 31A are arranged around the cooling pipe 92, to take more heat from the coils 31A provided in the stator 31.

The upper end face 201 of the housing 2 in the Z-axis direction is connected to a connector 41 including a power supplying wire and a signal line. Furthermore, in the housing 2, the controller 7 (corresponding to a control device according to the present invention) is provided. The wire or signal line pulled from the connector 41 into the housing 2 is connected to the controller 7. The controller 7 is provided with a central processing unit (CPU), a random access memory (RAM), a read only memory (ROM), and an erasable programmable ROM (EPROM), which are connected to one another via a bus. In the EPROM, various programs, various tables and others are stored. The program stored in the EPROM is loaded and executed in a work area of the RAM by the CPU, and through the execution of this program, the rotating motor 20, the linear motion motor 30, the positive pressure solenoid valve 63A, the negative pressure solenoid valve 63B and others are controlled. Thus, a function that meets a predetermined purpose is achieved by the CPU. Furthermore, output signals of the pressure sensor 64, the flow sensor 65, the strain gauge 37, the rotary encoder 24 and the linear encoder 38 are input into the controller 7.

Figure 3:
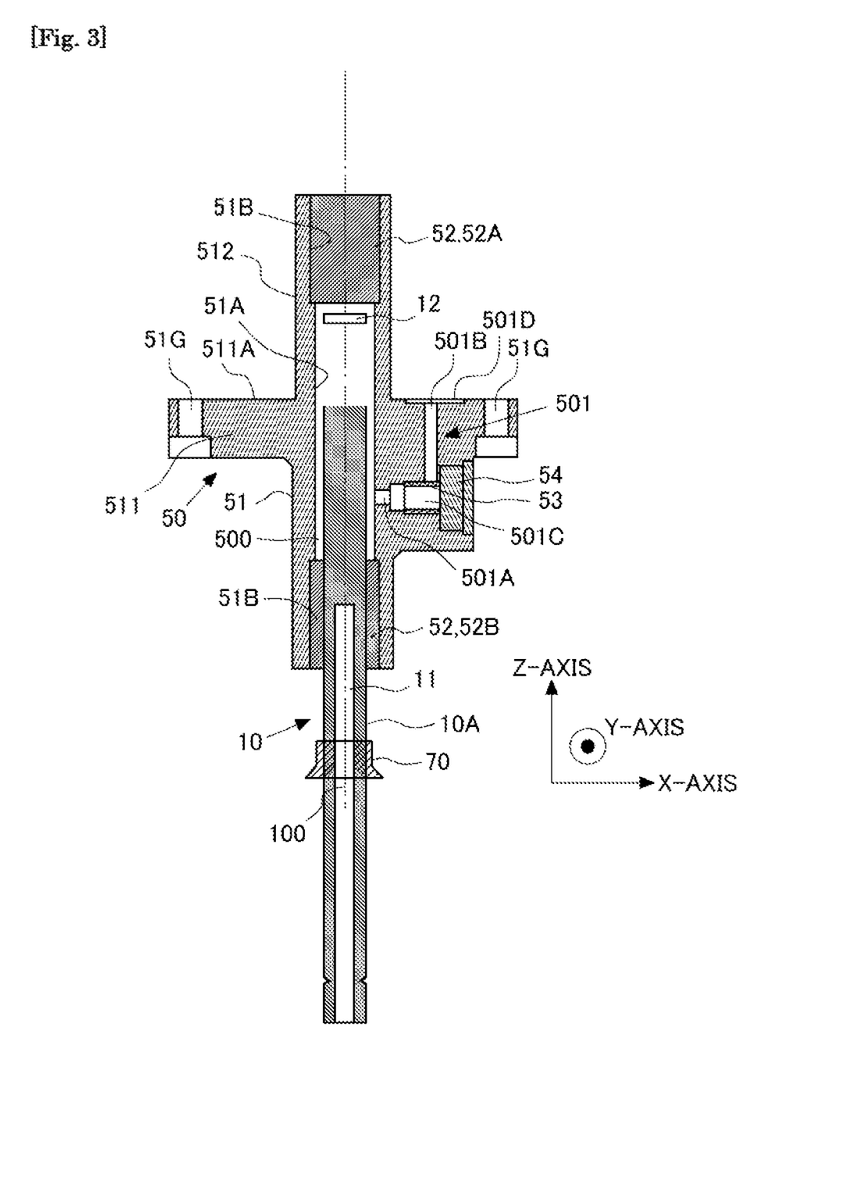
FIG. 3 is a cross-sectional view illustrating a schematic configuration including a shaft housing and a tip of a shaft according to the embodiment.

FIG. 3 is a cross-sectional view illustrating a schematic configuration including the shaft housing 50 and the tip 10A of the shaft 10. The shaft housing 50 includes a housing body 51, two rings 52, a filter 53, and a filter stop 54. In the housing body 51, a through hole 51A is formed into which the shaft 10 is inserted. The through hole 51A extends through the housing body 61 in the Z-axis direction, and an upper end of the through hole 51A in the Z-axis direction communicates with the through hole 2A formed in the housing 2. A diameter of the through hole 51A is larger than an outer diameter of the shaft 10. Consequently, a space is provided between an inner surface of the through hole 51A and an outer surface of the shaft 10. In opposite ends of the through hole 51A, enlarged parts 51B each having a hole diameter enlarged are provided. The rings 52 are fitted in two enlarged parts 51B, respectively. Each ring 52 is formed in a cylindrical shape, and an inner diameter of the ring 52 is slightly larger than the outer diameter of the shaft 10. Consequently, a space is also formed between an inner surface of the ring 62 and the outer surface of the shaft 10. Therefore, the shaft 10 is movable in the Z-axis direction in the ring 52, and the shaft 10 is rotatable about the central axis 100 in the ring 52. However, the space formed between the inner surface of the ring 52 and the outer surface of the shaft 10 is smaller than the space formed between the inner surface of the through hole 51A excluding the enlarged parts 51B and the outer surface of the shaft 10. Note that the ring 52 on the upper side in the Z-axis direction will be referred to as a first ring 52A, and the ring 52 on the lower side in the Z-axis direction will be referred to as a second ring 52B. The first ring 52A and the second ring 52B will be referred to simply as the rings 52 when the rings are not distinguished. In a material of the ring 52, for example, a metal or a resin may be used.

A protrusion 511 protruding in opposite right and left directions in the X-axis direction is formed in a central part of the housing body 51 in the Z-axis direction. In the protrusion 511, a mounting surface 511A is formed which is a surface parallel to the lower end face 202 of the housing 2, the surface coming in contact with the lower end face 202, when the shaft housing 50 is mounted to the lower end face 202 of the housing 2. The mounting surface 511A is a surface orthogonal to the central axis 100. Furthermore, a part 512 that is a part of the shaft housing 50 on the upper side of the mounting surface 511A in the Z-axis direction is formed to fit in the recess 202B formed in the housing 2, when the shaft housing 50 is mounted to the housing 2.

The space is provided between the inner surface of the through hole 51A and the outer surface of the shaft 10 as described above. As a result, in the housing body 51, an inner space 500 is formed which is a space surrounded with the inner surface of the through hole 51A, the outer surface of the shaft 10, a lower end face of the first ring 52A, and an upper end face of the second ring 52B. Furthermore, in the shaft housing 50, a control passage 501 is formed which communicates between an opening of the air flow passage 202A formed in the lower end face 202 of the housing 2 and the inner space 500 to form an air passage. The control passage 501 includes a first passage 501A extending in the X-axis direction, a second passage 501B extending in the Z-axis direction, and a filter part 501C that is a space where the first passage 501A and the second passage 501B are connected and the filter 53 is disposed. The first passage 501A has one end connected to the inner space 500, and the other end connected to the filter part 501C. The second passage 501B has one end opened in the mounting surface 511A and aligned to be connected to the opening of the air flow passage 202A.

Furthermore, the second passage 501B has the other end connected to the filter part 501C. In the filter part 501C, the filter 53 formed in a cylindrical shape is provided. The filter part 501C is formed in a columnar space extending in the X-axis direction such that a central axis coincides with that of the first passage 501A. An inner diameter of the filter part 501C is substantially equal to an outer diameter of the filter 53. The filter 63 is inserted into the filter part 501C in the X-axis direction. After the filter 53 is inserted into the filter part 6010, an end of the filter part 501C which is an insertion port of the filter 53 is closed with the filter stop 54. The other end of the second passage 501B is connected to the filter part 501C from a side of an outer circumferential surface of the filter 53. Furthermore, the other end of the first passage 501A communicates with a central side of the filter 53. Therefore, air flowing through a space between the first passage 501A and the second passage 501B flows through the filter 53. Therefore, foreign matter is captured by the filter 53, even if the foreign matter is sucked together with air into the inner space 500, for example, when the negative pressure is generated at the tip 10A. In the one end of the second passage 501B, a groove 501D is formed to hold sealant.

In vicinities of opposite ends of the protrusion 511 in the X-axis direction, two bolt holes 51G are formed into which bolts are inserted, when the shaft housing 50 is fixed to the housing 2 by use of the bolts. The bolt holes 51G extend through the protrusion 511 in the Z-axis direction and opens in the mounting surface 511A.

A hollow part 11 is formed on the tip 10A side of the shaft 10 such that the shaft 10 is hollow. The hollow part 11 has one end opened at the tip 10A. Furthermore, at the other end of the hollow part 11, a communication hole 12 that communicates between the inner space 500 and the hollow part 11 in the X-axis direction is formed. The communication hole 12 is formed to communicate between the inner space 500 and the hollow part 11, in an entire range of a stroke when the shaft 10 is moved in the Z-axis direction by the linear motion motor 30. Therefore, the tip 10A of the shaft 10 communicates with the air control mechanism 60 through the hollow part 11, the communication hole 12, the inner space 500, the control passage 501, and the air flow passage 202A. Note that the communication hole 12 may be formed in the Y-axis direction in addition to the X-axis direction.

According to the shaft 10 and the shaft housing 50 that are configured as described above, the communication hole 12 always communicates between the inner space 500 and the hollow part 11, even if the shaft 10 is at any position in the Z-axis direction when the linear motion motor 30 is driven to move the shaft 10 in the Z-axis direction. Furthermore, the communication hole 12 always communicates between the inner space 500 and the hollow part 11, even if a rotation angle of the shaft 10 is any angle about the central axis 100 when the rotating motor 20 is driven to rotate the shaft 10 about the central axis 100. Therefore, a communication state between the hollow part 11 and the inner space 500 is maintained even if the shaft 10 is in any state, and hence the hollow part 11 always communicates with the air control mechanism 60. For that reason, air in the hollow part 11 is sucked through the communication hole 12, the inner space 500, the control passage 501, the air flow passage 202A, and the shared passage 610 (these paths correspond to an air passage of the present invention) to the negative pressure passage 61B, regardless of the position of the shaft 10, by closing the positive pressure solenoid valve 63A and opening the negative pressure solenoid valve 63B in the air control mechanism 60. As a result, the negative pressure can be generated in the hollow part 11, regardless of the position of the shaft 10. That is, regardless of the position of the shaft 10, the negative pressure can be generated at the tip 10A of the shaft 10, and hence the workpiece W can be suctioned to the tip 10A of the shaft 10. Note that the space is also formed between the inner surface of the ring 52 and the outer surface of the shaft 10 as described above. However, this space is smaller than a space that forms the inner space 500 (i.e., the space formed between the inner surface of the through hole 51A and the outer surface of the shaft 10). Thus, in the air control mechanism 60, the positive pressure solenoid valve 63A is closed and the negative pressure solenoid valve 63B is opened, so that a flow rate of air flowing through the space between the inner surface of the ring 52 and the outer surface of the shaft 10 can be suppressed, even if air in the inner space 500 is sucked. Consequently, the negative pressure with which the workpiece W may be suctioned to the tip 10A of the shaft 10 can be generated at the tip 10A of the shaft 10. On the other hand, the positive pressure can be generated in the hollow part 11, if the positive pressure solenoid valve 63A is opened and the negative pressure solenoid valve 63B is closed in the air control mechanism 60, regardless of the position of the shaft 10. That is, since the positive pressure can be generated at the tip 10A of the shaft 10, the workpiece W can be quickly removed from the tip 10A of the shaft 10.

(Pick and Place Operation)

Description will be made as to pick and place of the workpiece W by use of actuator 1. The controller 7 executes a predetermined program to perform the pick and place. Note that when performing the pickup and place of the workpiece W, a suction nozzle 70 having a diameter corresponding to a size of the workpiece W is mounted to the tip 10A of the shaft 10. Then, during the pickup of the workpiece W, the positive pressure solenoid valve 63A and the negative pressure solenoid valve 63B are both in a closed state, until the suction nozzle 70 comes in contact with the workpiece W. In this case, the pressure of the tip 10A of the shaft 10 and the suction nozzle 70 is the atmospheric pressure. Then, the linear motion motor 30 moves the shaft 10 downward in the Z-axis direction. Upon contact of the suction nozzle 70 with the workpiece W, the linear motion motor 30 is stopped. Flow of air sucked out from the hollow part 11 to the negative pressure passage 61B is permitted, to generate the negative pressure at the tip 10A of the shaft 10 and the suction nozzle 70, by opening the negative pressure solenoid valve 63B while maintaining the positive pressure solenoid valve 63A in a closed state after the linear motion motor 30 is stopped. Afterward, the linear motion motor 30 moves the shaft 10 upward in the Z-axis direction. At this time, the shaft 10 is rotated by the rotating motor 20 as required. Thus, the workpiece W can be picked up.

Next, during the placing of the workpiece W, the shaft 10 in a state where the workpiece W is suctioned to the suction nozzle 70 is moved downward in the Z-axis direction by the linear motion motor 30. If the workpiece W is grounded, the linear motion motor 30 is stopped, to stop the movement of the shaft 10. Furthermore, the negative pressure solenoid valve 63B is closed to cut off the flow of air sucked out from the hollow part 11 to the negative pressure passage 61B, and the positive pressure solenoid valve 63A is opened to permit the flow of air supplied from a pump or the like through the positive pressure passage 61A to the hollow part 11. Consequently, the positive pressure is generated in the tip 10A of the shaft 10 and the suction nozzle 70. Afterward, the linear motion motor 30 moves the shaft 10 upward in the Z-axis direction, and the tip 10A of the shaft 10 accordingly leaves the workpiece W. Note that the actuator 1 may be configured to supply air to the hollow part 11 during the placing of the workpiece W, and may be configured, for example, by forming one end of the positive pressure passage 61A as an end open to atmosphere so that air is introduced from the end open to atmosphere through the positive pressure passage 61A to the hollow part 11, when the positive pressure solenoid valve 63A is opened.

Here, during the pickup of the workpiece W, it is detected, using the strain gauge 37, that the suction nozzle 70 comes in contact with the workpiece W. Hereinafter, this method will be described. Note that it is similarly detected that the workpiece W is grounded during the placing of the workpiece W. If the suction nozzle 70 comes in contact with the workpiece W and the suction nozzle 70 pushes the workpiece W, a load is generated between the shaft 10 and the workpiece W. That is, the shaft 10 receives a force from the workpiece W due to reaction when the shaft 10 applies the force to the workpiece W. The force received from the workpiece W by the shaft 10 acts in a direction to generate strain relative to the coupling arm 36. That is, the strain is generated in the coupling arm 36 at this time. This strain is detected by the strain gauge 37. Then, the strain detected by the strain gauge 37 has correlation with the force received from the workpiece W by the shaft 10. Consequently, the force received from the workpiece W by the shaft 10, that is, the load generated between the shaft 10 and the workpiece W can be detected based on a detected value of the strain gauge 37. A relation between the detected value of the strain gauge and the load can be obtained beforehand by experiment, simulation or the like.

Thus, since the load generated between the shaft 10 and the workpiece W can be detected based on the detected value of the strain gauge 37, for example, it may be determined, upon the generation of the load, that the suction nozzle 70 comes in contact with the workpiece W, or it may be determined, in consideration of influence of error or the like, that the suction nozzle 70 comes in contact with the workpiece W in a case where a detected load is equal to or larger than a predetermined load. Note that the predetermined load indicates a threshold by which it is determined that the suction nozzle 70 comes in contact with the workpiece W. Furthermore, the predetermined load may be set as the load with which it is possible to more securely pick up the workpiece W while inhibiting damage on the workpiece W. Additionally, the predetermined load can be changed in accordance with a type of workpiece W.

Furthermore, in the present embodiment, during the pickup of the workpiece W, it is determined whether or not the workpiece is appropriately suctioned to the suction nozzle 70 (suction determination), by using the above described sensing device. Hereinafter, this method will be described. In the present embodiment, in principle, the suction determination is performed based on the pressure detected by the pressure sensor 64. If it is detected that the suction nozzle 70 comes in contact with the workpiece W during the pickup of the workpiece W, as described above, the controller 7 switches the negative pressure solenoid valve 63B from the closed state to an opened state while maintaining the positive pressure solenoid valve 63A in the closed state. Consequently, air in the air passage including the shared passage 61C, the air flow passage 202A, the control passage 501, the inner space 500 and the communication hole 12 as well as air in the hollow part 11 is sucked out to the negative pressure passage 61B. Here, if air in the air passage and the hollow part 11 is sucked out to the negative pressure passage 61B in a state where the suction nozzle 70 is in contact with the workpiece W, a pressure in the air passage and hollow part 11 gradually decreases. In this case, the controller 7 monitors the pressure in the shared passage 61C by use of the pressure sensor 64, to determine whether or not the pressure in the shared passage 610 decreases to a predetermined pressure or lower. The predetermined pressure described herein is, as described above, the pressure by which it can be determined that the negative pressure, with which the workpiece W may be properly suctioned, is generated at the tip 10A of the shaft 10 (the suction nozzle 70), if the pressure in the shared passage 61C decreases to the predetermined pressure or lower, and the predetermined pressure is set in advance in accordance with the diameter of the suction nozzle 70. The predetermined pressure is set to a lower pressure (a pressure having a larger negative pressure degree) in a case where the diameter of the suction nozzle is large than in a case where the diameter is small. Note that since the diameter of the suction nozzle 70 is determined in accordance with the size of the workpiece W, the predetermined pressure may be set in accordance with the size of the workpiece W. Then, if the pressure detected by the pressure sensor 64 decreases to the predetermined pressure or lower, the controller 7 determines that the workpiece W is appropriately suctioned to the suction nozzle 70. In this case, the controller 7 moves the shaft 10 upward in the Z-axis direction by the linear motion motor 30, to pick up the workpiece W.

Note that as described above, the suction determination by use of the pressure sensor 64 is performed in a case where the suction nozzle 70 having a comparatively large diameter is mounted to the tip 10A of the shaft 10, as in a case where the size of the workpiece W is comparatively large. This is because in the case where the suction nozzle 70 having the comparatively large diameter is mounted to the tip 10A of the shaft 10, a difference tends to increase in pressure between a pressure in the shared passage 61C in a state where the workpiece W is suctioned to the suction nozzle 70 (a state where the suction nozzle 70 is closed) and a pressure in the shared passage 61C in a state where the workpiece W is not suctioned to the suction nozzle 70 (a state where the suction nozzle 70 is opened), and change in pressure at the tip 10A of the shaft 10 (the suction nozzle 70) is easy to be reflected immediately to the pressure in the shared passage 610, so that it can be accurately and immediately determined whether or not the workpiece W is appropriately suctioned to the suction nozzle 70, through the suction determination by use of the pressure sensor 64. On the other hand, in a case where the suction nozzle 70 having a comparatively small diameter is mounted to the tip 10A of the shaft 10, as in a case where the size of the workpiece W is comparatively small, the suction determination by use of the flow sensor 65 is performed. This is because in the case where the diameter of the suction nozzle 70 is comparatively small, as described above, a difference decreases between a pressure in the shared passage 61C in the state where the workpiece W is suctioned to the suction nozzle 70 (the state where the suction nozzle 70 is closed) and a pressure in the shared passage 61C in the state where the workpiece W is not suctioned to the suction nozzle 70 (the state where the suction nozzle 70 is opened), and hence it may be difficult to immediately perform accurate determination in the suction determination by use of the pressure sensor 64.

When picking up the workpiece W in a state where the suction nozzle 70 having the comparatively small diameter is mounted to the tip 10A of the shaft 10, the controller 7 switches the negative pressure solenoid valve 63B from the closed state to the opened state while maintaining the positive pressure solenoid valve 63A in the closed state, and then monitors the flow rate of air flowing through the shared passage 61C by use of the flow sensor 65, to determine whether or not the flow rate of air flowing through the shared passage 610 decreases to a predetermined flow rate or smaller. The predetermined flow rate described herein is, as described above, a flow rate by which it can be determined that the negative pressure with which the workpiece W may be appropriately suctioned is generated at the tip 10A of the shaft 10 (the suction nozzle 70), if the flow rate of air flowing through the shared passage 61C decreases to the predetermined flow rate or smaller. In other words, the predetermined flow rate is a flow rate by which it can be determined that the pressure in the shared passage 61C decreases to the predetermined pressure or lower, if the flow rate of air flowing through the shared passage 610 decreases to the predetermined flow rate or smaller. Then, if the flow rate detected by the flow sensor 65 decreases to the predetermined flow rate or smaller, the controller 7 determines that the workpiece W is appropriately suctioned to the suction nozzle 70. In this case, the controller 7 moves the shaft 10 upward in the Z-axis direction by the linear motion motor 30, to pick up the workpiece W.

Note that in a case where the workpiece W is picked up in the state where the suction nozzle 70 having the comparatively small diameter is mounted to the tip 10A of the shaft 10, the suction determination may be performed by using both the pressure sensor 64 and the flow sensor 65. That is, after the negative pressure solenoid valve 63B is switched from the closed state to the opened state while maintaining the positive pressure solenoid valve 63A in the closed state, the controller 7 may monitor the flow rate of air flowing through the shared passage 61C by use of the flow sensor 65, and monitor the pressure in the shared passage 61C by use of the pressure sensor 64. Then, it may be determined that the workpiece W is appropriately suctioned to the suction nozzle 70, on condition that the flow rate of air flowing through the shared passage 61C decreases to the predetermined flow rate or smaller and that the pressure in the shared passage 61C decreases to the predetermined pressure or lower.

(Effect of Configuration of the Present Embodiment)

As described above, the actuator 1 according to the present embodiment includes the sensing device including the pressure sensor 64 that detects the pressure in the shared passage 61C and the flow sensor 65 that detects the flow rate of air flowing through the shared passage 610. Therefore, during the pickup of the workpiece W, it is possible to perform the suction determination by use of the flow sensor 65 and the pressure sensor 64. For example, in a case where accurate suction determination can be immediately performed by using the pressure sensor 64, as in the case where the suction nozzle 70 having the comparatively large diameter is mounted to the tip 10A of the shaft 10 (i.e., a case where the workpiece W having the comparatively large size is picked up), it is possible to perform the suction determination by use of the pressure sensor 64. On the other hand, in a case where it is difficult to immediately perform accurate suction determination by use of the pressure sensor 64, as in a case where the suction nozzle 70 having the comparatively small diameter is mounted to the tip 10A of the shaft 10 (i.e., the case where the workpiece W having the comparatively small size is picked up), it is possible to perform the suction determination by use of the flow sensor 65, or the suction determination by use of the flow sensor 65 and the pressure sensor 64. Consequently, it is possible to immediately perform accurate suction determination, without being influenced by the diameter of the suction nozzle 70, the size of the workpiece W, or the like.

Besides, in the present embodiment, since the pressure sensor 64 and flow sensor 65 of the sensing device are arranged at a position (the shared passage 61C) closer to the tip 10A of the shaft 10 than the negative pressure solenoid valve 63B is, a pressure and flow rate having high correlation with the pressure at the tip 10A can be correctly and immediately detected. Consequently, it is possible to more correctly and more immediately perform the suction determination by use of the flow sensor 65 and/or the pressure sensor 64.

Furthermore, in the present embodiment, the flow sensor 65 is disposed at a position closer to the tip 10A of the shaft 10 than the pressure sensor 64 is, so that it is possible to accurately and immediately detect the flow rate having high correlation with the pressure at the tip 10A, in a case where the suction determination by use of the flow sensor 65 or the suction determination by use of the flow sensor 65 and the pressure sensor 64 is performed, as in a case where the suction nozzle 70 having the comparatively small diameter is mounted to the tip 10A of the shaft 10. In particular, in a case where the suction determination is performed by using both the flow sensor 65 and the pressure sensor 64, higher responsiveness is required for the flow sensor 65 than for the pressure sensor 64, and hence the flow sensor 65 is disposed at the position closer to the tip 10A of the shaft 10 than the pressure sensor 64 is, so that it is possible to detect the flow rate having high correlation with the pressure at the tip 10A with high responsiveness. Therefore, accurate suction determination can be immediately performed even in a case where the suction nozzle 70 having the comparatively small diameter is mounted to the tip 10A of the shaft 10.

(Modification)

In the above embodiment, the example is described where during the pickup of the workpiece W, the positive pressure solenoid valve 63A and the negative pressure solenoid valve 63B are closed until the suction nozzle 70 comes in contact with the workpiece W, and it is then detected that the suction nozzle 70 comes in contact with the workpiece W, followed by opening the negative pressure solenoid valve 63B, to start suction of air from the air passage and the hollow part 11. On the other hand, in this modification, during the pickup of the workpiece W, the negative pressure solenoid valve 63B is opened, to start suction of air from the air passage and the hollow part 11, in a stage before the suction nozzle 70 comes in contact with the workpiece W.

Figure 4:
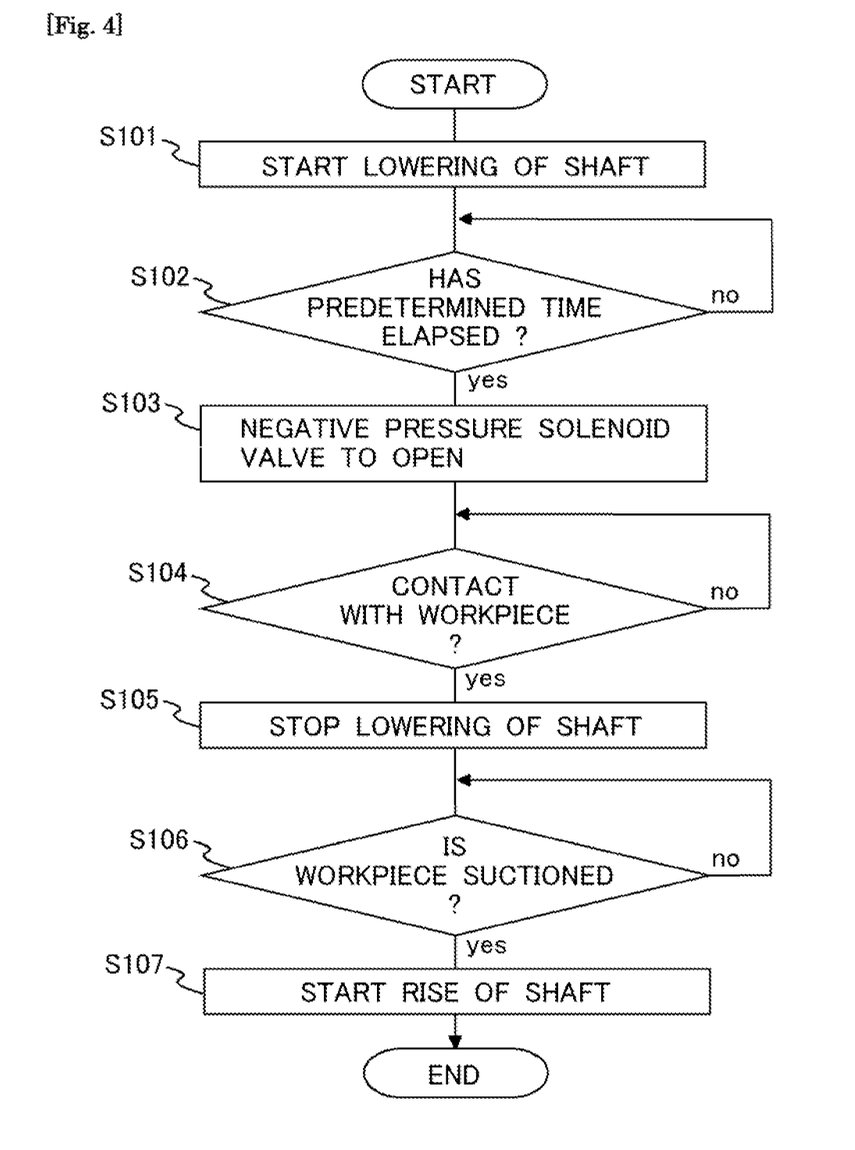
FIG. 4 is a flowchart illustrating an operation of an actuator when picking up a workpiece W in a modification.

Here, description is made as to an operation of the actuator during the pickup of the workpiece W, with reference to FIG. 4. FIG. 4 is a diagram illustrating processing flow to be performed by the controller 7 during the pickup of the workpiece W.

In the processing flow of FIG. 4, the controller 7 first drive the linear motion motor 30, to start movement (lowering) of the shaft 10 downward in the Z-axis direction (step S101). Note that at this time, the positive pressure solenoid valve 63A and the negative pressure solenoid valve 63B are both maintained in the closed state.

The controller 7 determines whether or not predetermined time has elapsed since time when the shaft 10 starts to lower (step S102). The "predetermined time" described herein is a time (=(lowering time)−(response delay time)) corresponding to a difference between a time (lowering time) required from time when the shaft 10 starts to lower to time when the tip 10A of the shaft 10 (the suction nozzle 70) comes in contact with the workpiece W and a time (response delay time) required from time when the negative pressure solenoid valve 63B starts to open to time when the detected value of the flow sensor 65 starts to change (time when the negative pressure applied from the negative pressure passage 61B reaches the position of the flow sensor 65). Note that the lowering time and the response delay time are obtained in advance based on a result of experiment or simulation, or the like, so that the predetermined time can be calculated in advance. In a case where the predetermined time has not elapsed yet since the time when the shaft 10 starts to lower (in a case where negative determination is made in the step S102), the controller 7 repeatedly executes processing of the step S102. On the other hand, in a case where the predetermined time has elapsed since the time when the shaft 10 starts to lower (in a case where affirmative determination is made in the step S102), the controller 7 advances to processing of step S103.

In the step S103, the controller 7 switches the negative pressure solenoid valve 63B from the closed state to the opened state while maintaining the positive pressure solenoid valve 63A in the closed state. Subsequently, the controller 7 uses the strain gauge 37 to determine whether or not the suction nozzle 70 comes in contact with the workpiece W (step S104). In a case where the suction nozzle 70 does not come in contact with the workpiece W (a case where negative determination is made in the step S104), the controller 7 repeatedly executes the processing of the step S104. On the other hand, in a case where the suction nozzle 70 is in contact with the workpiece W (a case where affirmative determination is made in the step S104), the controller 7 advances to processing of step S105.

In the step S105, the controller 7 stops the linear motion motor 30 to stop movement (lowering) of the shaft 10 downward in the Z-axis direction. Subsequently, the controller 7 determines whether or not the workpiece W is appropriately suctioned to the suction nozzle 70 (step S106). In this case, if the diameter of the suction nozzle 70 mounted to the tip 10A of the shaft 10 is comparatively large, the controller 7 may determine that the workpiece W is appropriately suctioned to the suction nozzle 70, on condition that the pressure detected by the pressure sensor 64 decreases to the predetermined pressure or lower, as described in the above embodiment. Furthermore, if the diameter of the suction nozzle 70 mounted to the tip 10A of the shaft 10 is comparatively small, the controller 7 may determine that the workpiece W is appropriately suctioned to the suction nozzle 70, on condition that the flow rate detected by the flow sensor 65 decreases to the predetermined flow rate or smaller, or may determine that the workpiece W is appropriately suctioned to the suction nozzle 70, on condition that the flow rate detected by the flow sensor 65 decreases to the predetermined flow rate or smaller, and that the pressure detected by the pressure sensor 64 decreases to the predetermined pressure or lower, as described in the above embodiment. Then, in a case where it is determined that the workpiece W is not appropriately suctioned to the suction nozzle 70 (a case where negative determination is made in the step S106), the controller 7 repeatedly executes the processing of the step S106. On the other hand, in a case where it is determined that the workpiece W is appropriately suctioned to the suction nozzle 70 (a case where affirmative determination is made in the step S106), the controller 7 advances to processing of step S107.

In the step S107, the controller 7 drives the linear motion motor 30 to start movement (rise) of the shaft 10 upward in the Z-axis direction, thereby picking up the workpiece W.

In a case where the workpiece W is picked up by a procedure illustrated in FIG. 4 described above, the negative pressure solenoid valve 63B is opened, at timing before the suction nozzle 70 comes in contact with the workpiece W, and at timing determined such that the detected value of the flow sensor 65 starts to change when the suction nozzle 70 comes in contact with the workpiece W. Consequently, the detected value of the flow sensor 65 starts to change at the timing when the suction nozzle 70 comes in contact with the workpiece W. As a result, when the suction nozzle 70 comes in contact with the workpiece W, or in early time after the suction nozzle 70 comes in contact with the workpiece W, the negative pressure can be generated at the tip 10A of the shaft 10 (the suction nozzle 70). Therefore, the workpiece W can be suctioned to the suction nozzle 70 in earlier time, as compared with a case where the negative pressure solenoid valve 63B is opened upon the contact of the suction nozzle 70 with the workpiece W, as described in the above embodiment.

Therefore, according to the present modification, it is possible to more immediately perform suction determination of a large number of various workpieces W, and hence tact time for pickup can be further shortened.

Note that in FIG. 4 described above, the processing flow is illustrated in the case where the time (lowering time) required from the time when the shaft 10 starts to lower to the time when the suction nozzle 70 comes in contact with the workpiece W is longer than the time (the response delay time) required from the time when the negative pressure solenoid valve 63B starts to open to the time when the detected value of the flow sensor 65 starts to change, but it may be assumed a case where the response delay time is longer than the lowering time. In this case, the controller 7 may first open the negative pressure solenoid valve 63B, and then drive the linear motion motor 30, to start the movement (lowering) of the shaft 10 downward in the Z-axis direction, at time when the predetermined time (=(the response delay time)−(the lowering time)) elapses. Consequently, it is possible to more immediately perform the suction determination of the workpiece W also in a case where the lowering time is longer than the response delay time.

Furthermore, in FIG. 4 described above, the example is illustrated where the negative pressure solenoid valve 63B is opened at timing before the suction nozzle 70 comes in contact with the workpiece W, and at timing determined such that the detected value of the flow sensor 65 starts to change when the suction nozzle 70 comes in contact with the workpiece W, but the negative pressure solenoid valve 63B may be opened at the timing before the suction nozzle 70 comes in contact with the workpiece W, and at timing determined such that the detected value of the pressure sensor 64 starts to change when the suction nozzle 70 comes in contact with the workpiece W. Also, in this case, when the suction nozzle 70 comes in contact with the workpiece W, or in early time after the suction nozzle 70 comes in contact with the workpiece W, the negative pressure can be generated at the tip 10A of the shaft 10 (the suction nozzle 70).

REFERENCE SIGNS LIST 1 actuator
2 housing
7 controller
10 shaft
10A tip
11 hollow part
20 rotating motor
22 stator
23 rotor
30 linear motion motor
31 stator
32 mover
36 coupling arm
37 strain gauge
50 shaft housing
60 air control mechanism
61B negative pressure passage
61C shared passage
63B negative pressure solenoid valve
64 pressure sensor
65 flow sensor
70 suction nozzle
202A air flow passage
500 inner space
501 control passage

The invention claimed is:

1. An actuator sensing device to be applied to an actuator comprising a shaft that is movable in an axial direction, the shaft including a hollow part formed on at least a tip side of the shaft such that an interior of the shaft is hollow, and a housing that houses a part of the shaft in such a manner that the tip side of the shaft protrudes outward from the housing, the actuator being configured to generate a negative pressure in the hollow part to suction a workpiece to a tip of the shaft, thereby picking up the workpiece, the sensing device comprising:

an air passage disposed in the housing between a pump located outside of the housing and the hollow part, the air passage being a passage through which air sucked out from the hollow part by the pump flows when the negative pressure is applied to the hollow part;
a valve unit disposed in a middle of the air passage in the housing, to cut off or permit flow of air sucked out from the hollow part;
a pressure sensor provided in a middle of the air passage between the valve unit and the hollow part in the housing, to detect a pressure in the air passage; and
a flow sensor provided in a middle of the air passage between the hollow part and the pressure sensor in the housing, to detect a flow rate of air flowing through the air passage.

2. An actuator control system comprising the sensing device according to claim 1, comprising:

a control device that causes the shaft to move upward in an axial direction to pick up the workpiece, when the flow rate detected by the flow sensor decreases to a predetermined flow rate or smaller and/or when the pressure detected by the pressure sensor decreases to a predetermined pressure or lower.

3. An actuator control system comprising the sensing device according to claim 1, comprising:

a control device that controls the valve unit to change flow of air sucked out from the hollow part from a cutoff state to a permitted state, at timing before the tip of the shaft comes in contact with the workpiece, and at timing determined such that a detected value of the flow sensor starts to change when the tip of the shaft comes in contact with the workpiece, in a case where the shaft is moved in an axial direction from a position where the tip of the shaft is away from the workpiece toward a position where the tip of the shaft comes in contact with the workpiece.

* * * * *